(12) United States Patent
Wang et al.

(10) Patent No.: US 7,479,603 B2
(45) Date of Patent: Jan. 20, 2009

(54) FLEXIBLE FLAT CABLE ASSEMBLY AND IMAGE ACQUIRING DEVICE USING THE SAME

(75) Inventors: Chun-Min Wang, Shengang Township, Taichung County (TW); Chin-Chung Tsai, Hsinchu (TW)

(73) Assignee: Avision Inc. (TW)

( * ) Notice: Subject to any disclaimer, the term of this patent is extended or adjusted under 35 U.S.C. 154(b) by 0 days.

(21) Appl. No.: 11/898,007

(22) Filed: Sep. 7, 2007

(65) Prior Publication Data

US 2008/0076293 A1 Mar. 27, 2008

(30) Foreign Application Priority Data

Sep. 22, 2006 (TW) .............................. 95135049 A

(51) Int. Cl.
*H01B 7/08* (2006.01)

(52) U.S. Cl. ................................................. 174/117 F
(58) Field of Classification Search ............. 174/117 F, 174/117 FF; 358/497
See application file for complete search history.

(56) References Cited

U.S. PATENT DOCUMENTS

| 4,746,766 | A | * | 5/1988 | Soulard | ........................ | 174/36 |
| 6,166,332 | A | * | 12/2000 | Farrow et al. | ................ | 174/135 |
| 6,417,455 | B1 | * | 7/2002 | Zein et al. | ................. | 174/117 F |

FOREIGN PATENT DOCUMENTS

JP           2005-70492        *    3/2005

* cited by examiner

*Primary Examiner*—Chau N Nguyen

(57) ABSTRACT

A flexible flat cable assembly includes a flexible flat cable and a shaping member. The flexible flat cable is composed of a plurality of wires arranged in parallel. The shaping member is disposed on one part of the flexible flat cable to shape the flexible flat cable to substantially form a first bending angle.

10 Claims, 4 Drawing Sheets

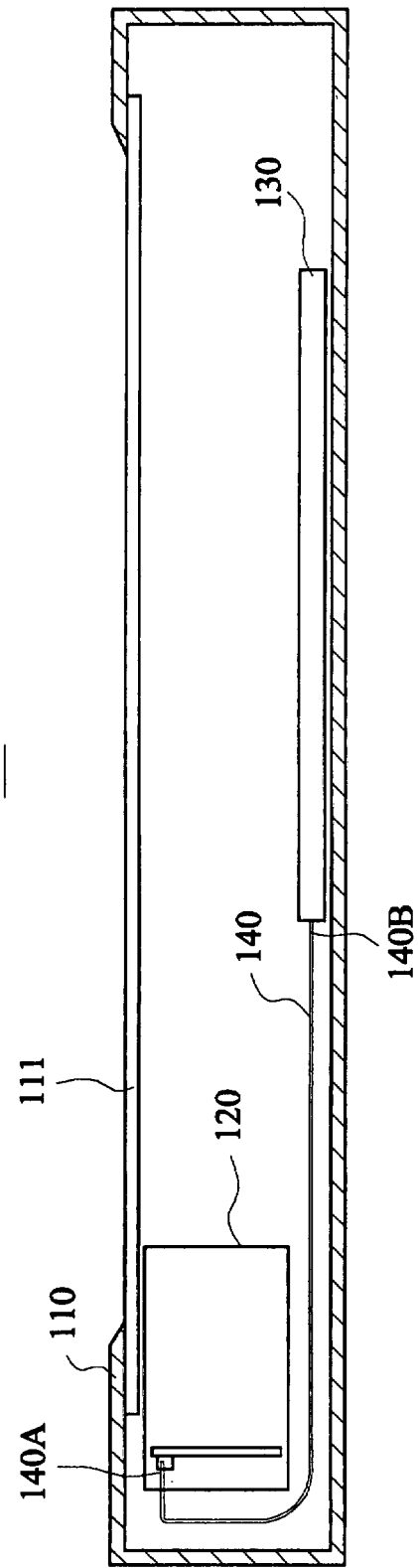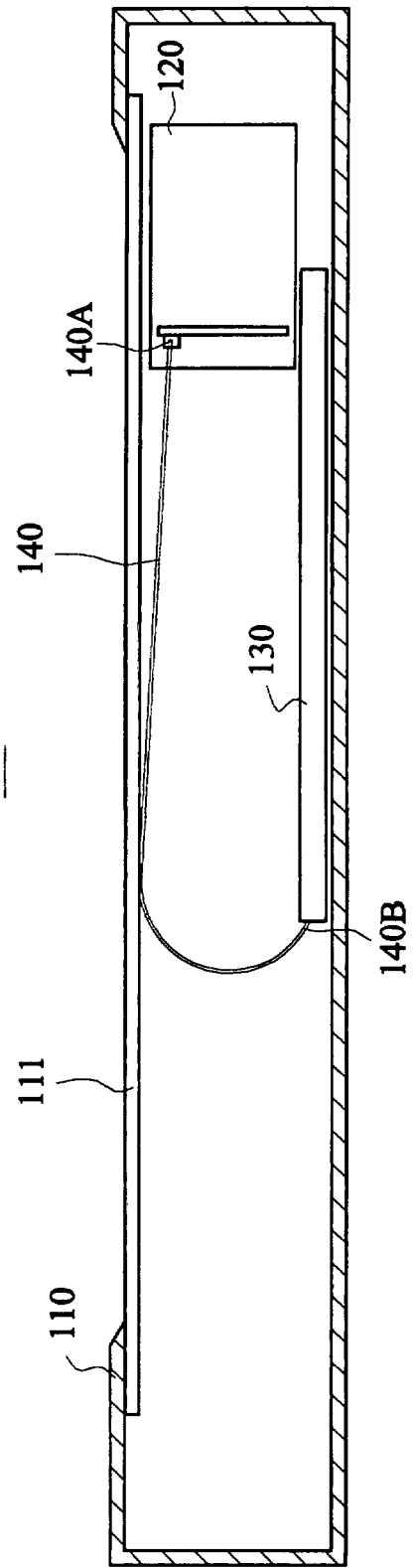

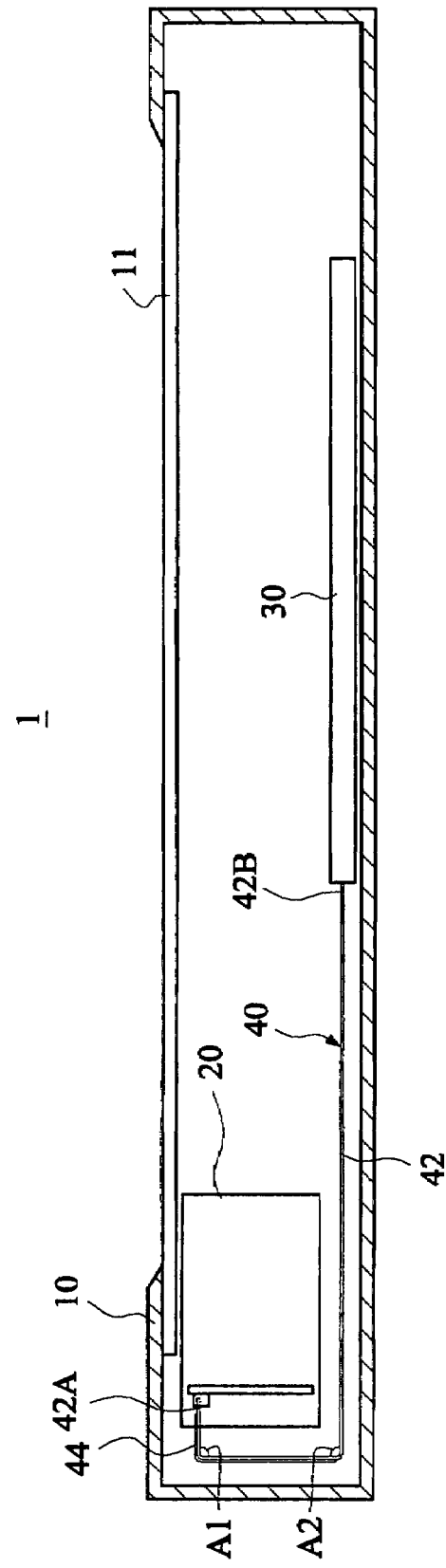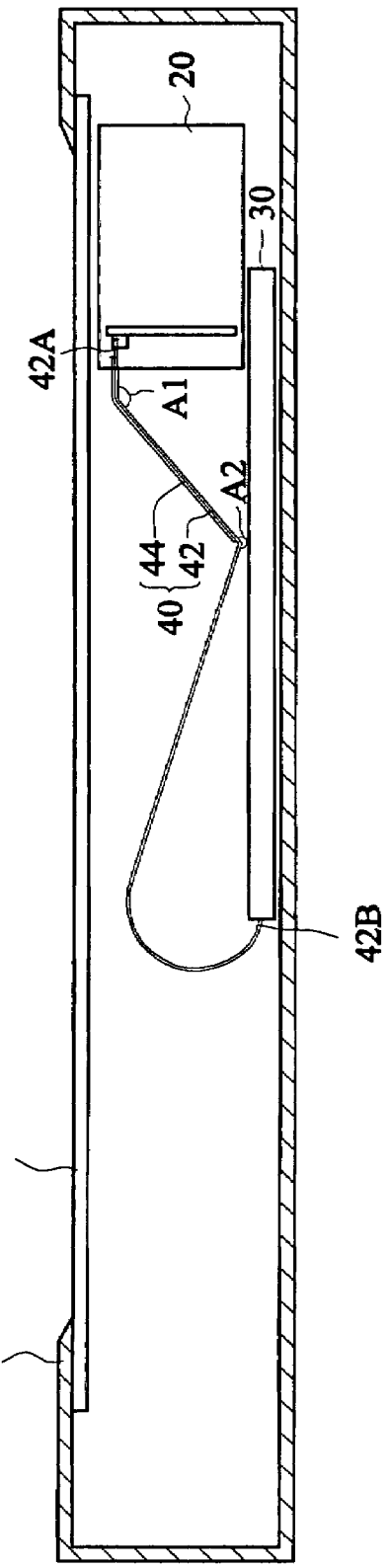

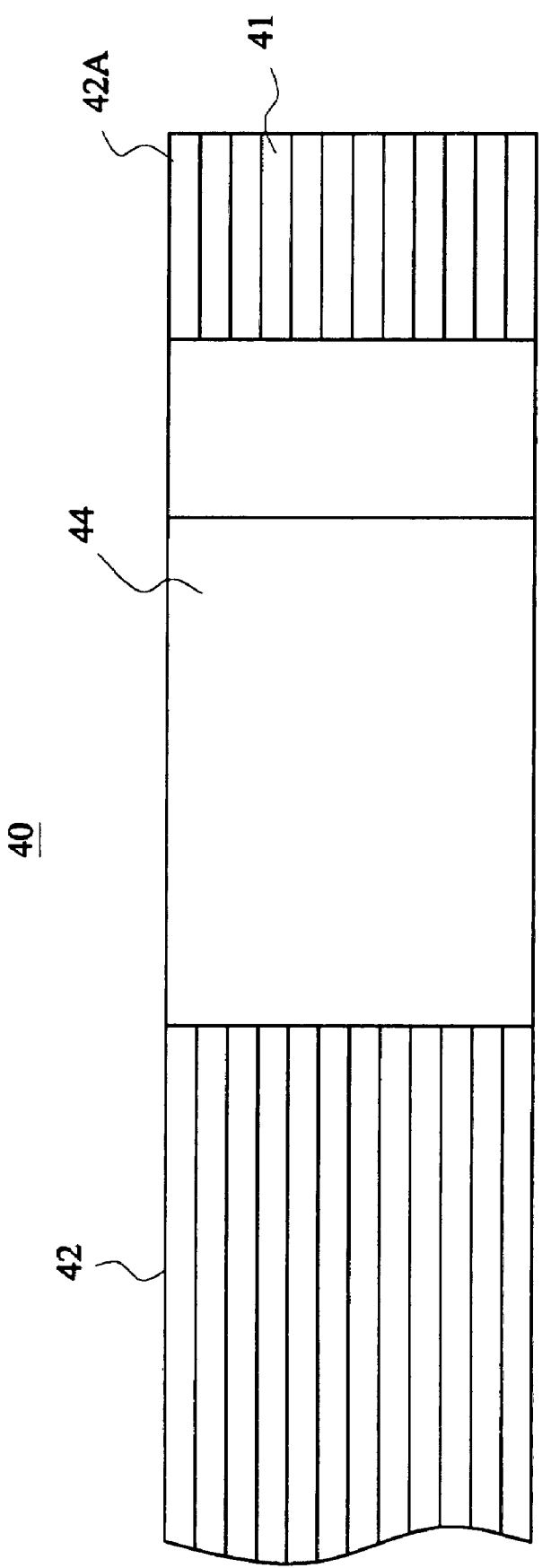

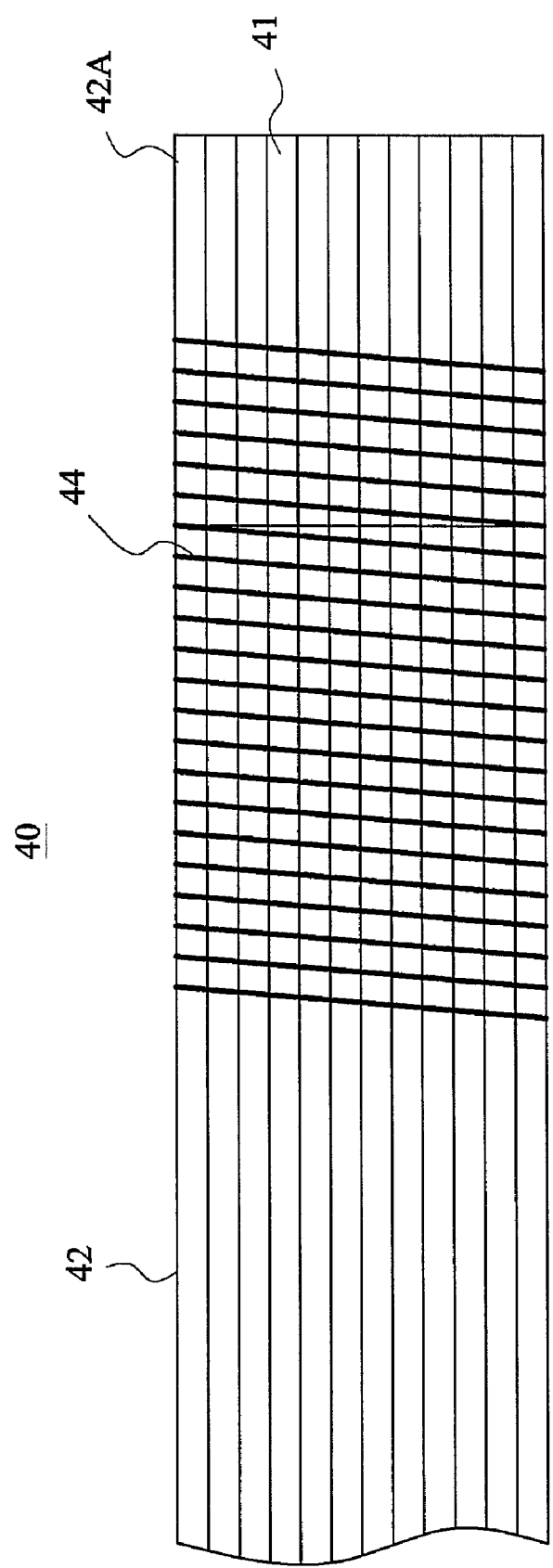

FLEXIBLE FLAT CABLE ASSEMBLY AND IMAGE ACQUIRING DEVICE USING THE SAME

BACKGROUND OF THE INVENTION

1. Field of Invention

The invention relates to a flexible flat cable assembly and an image acquiring device using the same, and more particularly to a flexible flat cable assembly having a shaping member and an image acquiring device using the flexible flat cable assembly.

2. Related Art

A conventional flatbed scanner includes a movable scanning module and a stationary mainboard. The relative position between the scanning module and the mainboard continuously changes during the scanning process. So, a flexible flat cable for connecting the scanning module to the mainboard is needed to transmit an image signal to the mainboard without influencing the movement of the scanning module.

FIGS. 1 and 2 are schematic side views showing a conventional image acquiring device 101. Referring to FIGS. 1 and 2, the conventional image acquiring device 101 is a flatbed scanner including a housing 110, a scanning module 120, a mainboard 130 and a flexible flat cable 140. A scan platen 111, which is usually a glass platen, is mounted on the housing 110. The scanning module 120 is movably mounted in the housing 110. The mainboard 130 is disposed and fixed in the housing 110 and performs controlling and signal processing operations. The flexible flat cable 140 connects the scanning module 120 to the mainboard 130.

The flexible flat cable 140 has a plurality of wires arranged in parallel, and has a first terminal 140A and a second terminal 140B.

As shown in FIG. 1, when the first terminal 140A is located on a left side of the second terminal 140B, the flexible flat cable 140 will not rub against the scan platen 111.

As shown in FIG. 2, when the first terminal 140A is located on a right side of the second terminal 140B, the highest point of the flexible flat cable 140 directly contacts the scan platen 111, and the flexible flat cable 140 rubs against the scan platen 111. So, the scan platen 111 may be scratched and the image quality is affected, or the flexible flat cable 140 may break, and the operation of the image acquiring device is therefore interrupted.

SUMMARY OF THE INVENTION

It is therefore an object of the invention to provide a flexible flat cable assembly having a shaping member and an image acquiring device using the same to prevent the flexible flat cable assembly from rubbing against a scan platen.

To achieve the above-identified object, the invention provides a flexible flat cable assembly including a flexible flat cable and a shaping member. The flexible flat cable has a plurality of wires arranged in parallel. The shaping member disposed on one part of the flexible flat cable is for shaping the flexible flat cable to substantially form a first bending angle.

The invention also provides an image acquiring device including a housing, a scanning module, a mainboard and a flexible flat cable assembly. The scanning module is movably mounted in the housing. The mainboard is disposed and fixed in the housing. The flexible flat cable assembly is for connecting the scanning module to the mainboard. The flexible flat cable assembly includes a flexible flat cable and a shaping member. The flexible flat cable has a plurality of wires arranged in parallel. The shaping member disposed on one part of the flexible flat cable is for shaping the flexible flat cable to substantially form a first bending angle and a second bending angle.

Further scope of the applicability of the present invention will become apparent from the detailed description given hereinafter. However, it should be understood that the detailed description and specific examples, while indicating preferred embodiment of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 1 and 2 are schematic side views showing a conventional image acquiring device;

FIGS. 3 and 4 are schematic side views showing an image acquiring device according to a preferred embodiment of the invention;

FIG. 5 is a schematic top view showing a flexible flat cable assembly of FIG 4; and FIG. 6 is a schematic top view showing a modified flexible flat cable assembly.

DETAILED DESCRIPTION OF THE INVENTION

The present invention will be apparent from the following detailed description, which proceeds with reference to the accompanying drawings, wherein the same references relate to the same elements.

FIGS. 3 and 4 are schematic side views showing an image acquiring device 1 according to a preferred embodiment of the invention, and FIG. 5 is a schematic top view showing a flexible flat cable assembly of FIG. 4. Referring to FIGS. 3 to 5, the image acquiring device 1 of this embodiment is a flatbed scanner including a housing 10, a scanning module 20, a mainboard 30 and a flexible flat cable assembly 40. A scan platen 11, such as a glass platen, is mounted on the housing 10. The scanning module 20 is movably mounted in the housing 10. The mainboard 30 is disposed and fixed in the housing 10 and performs controlling and signal processing operations. The flexible flat cable assembly 40 connects the scanning module 20 to the mainboard 30 and includes a flexible flat cable 42 and a shaping member 44. The flexible flat cable 42 has a first terminal 42A and a second terminal 42B.

The flexible flat cable 42 has a plurality of wires 41 arranged in parallel. The shaping member 44 is disposed on one part of the flexible flat cable 42 and is for shaping the flexible flat cable 42 to substantially form a first bending angle A1 and a second bending angle A2. It is to be noted that the first bending angle A1 is defined by the angle of the shaping member 44 itself, and two sides of the second bending angle A2 are respectively defined by the shaping member 44 and the flexible flat cable 42. Thus, when the flexible flat cable assembly 40 is not yet attached to the image acquiring device 1, the flexible flat cable assembly 40 may only have the first bending angle A1.

In this embodiment, the shaping member 44 is a thin sheet, made of plastic or metallic material and adhered to the flexible flat cable 42, or may be a polyester film (Mylar). The shaping member 44 is closer to the first terminal 42A of the flexible flat cable 42 than to the second terminal 42B of the flexible flat cable 42, and the first terminal 42A is higher than the second terminal 42B. Alternatively, the shaping member 44 may be an elastic member, such as an elastic metal wire, wound around the flexible flat cable 42, as shown in FIG. 6. Alternatively, the shaping member 44 may be formed of an elastic material, such as rubber, coated on the flexible flat cable 42.

As shown in FIG. 3, when the first terminal 42A is located on one side of the second terminal 42B (e.g., the left side in this embodiment), the elasticity of the shaping member 44 makes the shaping member 44 form an angle of 90 degrees, and the lower end of the flexible flat cable 42 is pressed by the end of the shaping member 44. At this time, the first bending angle A1 and the second bending angle A2 range from 0 to 180, and are approximate 90 degrees.

As shown in FIG. 4, when the first terminal 42A is disposed on the other side of the second terminal 42B (e.g., the right side in this embodiment), the shaping member 44 is twitched by the flexible flat cable 42 so that the first bending angle A1 changes from 90 degrees to about 135 degrees, and the lower end of the shaping member 44 presses the flexible flat cable 42 down so that the second bending angle A2 is equal to about 240 degrees. Thus, when the scanning module 20 is moved back and forth, the first bending angle A1 ranges from 0 to 180 degrees, and the second bending angle A2 ranges from 180 to 360 degrees.

According to the structure of the invention, the highest point of the flexible flat cable never touches the scan platen so that the flexible flat cable cannot rub against the scan platen.

While the invention has been described by way of examples and in terms of a preferred embodiment, it is to be understood that the invention is not limited thereto. To the contrary, it is intended to cover various modifications. Therefore, the scope of the appended claims should be accorded the broadest interpretation so as to encompass all such modifications.

What is claimed is:

1. A flexible flat cable assembly, comprising:
    a flexible flat cable having a plurality of wires arranged in parallel; and
    a shaping member, disposed on one part of the flexible flat cable, for shaping the flexible flat cable to substantially form a first bending angle and a second bending angle, wherein:
    the shaping member is closer to a first terminal of the flexible flat cable than to a second terminal of the flexible flat cable;
    the first terminal is located at a position higher than a position of the second terminal; and
    the first bending angle and the second bending angle range from 0 to 180 degrees when the first terminal is located on one side of the second terminal, and the first bending angle ranges from 0 to 180 degrees and the second bending angle ranges from 180 to 360 degrees when the first terminal is located on the other side of the second terminal.

2. The assembly according to claim 1, wherein the shaping member is a thin sheet adhered to the flexible flat cable.

3. The assembly according to claim 2, wherein the thin sheet is a polyester film.

4. The assembly according to claim 1, wherein the shaping member is an elastic member wound around the flexible flat cable.

5. The assembly according to claim 1, wherein the shaping member is made of an elastic material coated on the flexible flat cable.

6. An image acquiring device, comprising:
    a housing;
    a scanning module movably mounted in the housing;
    a mainboard disposed and fixed in the housing; and
    a flexible flat cable assembly for connecting the scanning module to the mainboard, the flexible flat cable assembly comprising:
    a flexible flat cable having a plurality of wires arranged in parallel; and
    a shaping member, disposed on one part of the flexible flat cable, for shaping the flexible flat cable to substantially form a first bending angle and a second bending angle, wherein:
    the shaping member is closer to a first terminal of the flexible flat cable than to a second terminal of the flexible flat cable;
    the first terminal is located a position higher than a position of the second terminal; and
    the first bending angle and the second bending angle range from 0 to 180 degrees when the first terminal is located on one side of the second terminal, and the first bending angle ranges from 0 to 180 degrees and the second bending angle ranges from 180 to 360 degrees when the first terminal is located on the other side of the second terminal.

7. The device according to claim 6, wherein the shaping member is a thin sheet adhered to the flexible flat cable.

8. The device according to claim 7, wherein the thin sheet is a polyester film.

9. The device according to claim 6, wherein the shaping member is an elastic member wound around the flexible flat cable.

10. The device according to claim 6, wherein the shaping member is made of an elastic material coated on the flexible flat cable.

* * * * *